SILICON DEVICE HAVING A LEAD-SILICATE THEREON AND METHOD OF FORMING THE SAME

Filed June 30, 1969

INVENTOR:
GERALD C. HUTH,
BY Carl O. Thomas
HIS ATTORNEY.

United States Patent Office 3,669,731
Patented June 13, 1972

3,669,731

SILICON DEVICE HAVING A LEAD-SILICATE THEREON AND METHOD OF FORMING THE SAME

Gerald C. Huth, Chester Springs, Pa., assignor to General Electric Company

Filed June 30, 1969, Ser. No. 837,717
Int. Cl. H01l 3/00
U.S. Cl. 117—201 7 Claims

ABSTRACT OF THE DISCLOSURE

A slurry of an oxide of lead and an organic vehicle is prepared and applied by suitable means to a clean silicon wafer. The organic vehicle is allowed to volatilize. The silicon wafer is then heated in an oxygen atmosphere to a temperature at least above the eutectic of the oxide of lead and silicon dioxide and preferably above the liquidus for that composition, and maintained at that temperature for a short time to form a lead-silicate glass of desired thickness. By cooling the silicon wafer at a controlled rate, the glass removes or getters any impurities which might degrade the performance of any P–N junction therein by diffusion during the process and thereafter protects the silicon wafer from the ambient.

This invention relates generally to semiconductor products and to processes for manufacturing the same; more specifically, it relates to a method for forming a glass on a silicon wafer and to a silicon device constructed with such glass.

Experimenters have long known that even the purest silicon device can be diffused with impurities upon a subsequent heating thereof if those impurities have been left on the silicon wafer surface by a chemical etchant. Such impurities generally are in the form of a metal, such as iron, nickel, or copper. In the art, these metals are known as fast diffusers, for upon heating of the silicon wafer, they will diffuse throughout a silicon wafer in less than a minute, thus changing the characteristics of any doped region from that initially desired. Further, if a P–N junction has been established within the wafer, the fast diffusers generally precipitate out on dislocations on the silicon wafer surface and form an effective short across the junction.

Therefore, many attempt have been made in the prior art to form a coating on the silicon wafer which will attract these metal impurities thereto or "getter" the wafer. These processes depend on the fact that the metal impurities are more soluble in the coating than in the silicon structure. Moreover, it is desired that the coating thereafter protect any P–N junction from further contamination by shielding it from ambient conditions, such as moisture, and the application of additional impurities.

In the past, this coating generally comprised an oxide of a metal, such as lead, which adhered to the wafer by some reaction between the oxide and silicon or silicon dioxide. However, these oxides do not always produce the gettering results desired. Moreover, the oxides have not been found to be permanent in that they may be removed by destructive ambient conditions.

Other experimenters have tried to meet this problem by attempting to form a glass on a silicon structure. The glass has an advantage over an oxide in that it is capable of being formed in greater thickness, thus allowing better junction shielding. Also, it has been found that a glass, if properly formed, effectively getters any impurities from the silicon. Prior art processes in forming glasses on semiconductor structures have relied on placing the semiconductor in an atmosphere containing a vaporified oxide of a metal, such as lead, and heating the wafer in that atmosphere so that a silicate glass containing the metal is formed on the wafer. Such a process has a disadvantage in that the areas in which the glass is to be formed cannot be controlled without mechanically masking the wafer surface, which in turn breeds further contamination. Moreover, it has been found that the vapors of certain metal oxides, such as lead oxide, are destructive to silicon.

It is, therefore, a specific object of this invention to form a silicate glass on a silicon wafer in an atmosphere essentially free of metal oxide vapor.

It is a further object of this invention to produce a silicon structure having a lead silicate glass thereon which effectively getters impurities from the silicon interior and surface and thereafter protects the wafer against further contamination by the ambient.

These objects are achieved by using the discovery that a lead-silicate glass may be formed on the surface of a silicon wafer by applying a slurry of an oxide of lead and a volatilizable organic vehicle thereto, heating the wafer to form a lead-silicate glass of desired thickness, and controlling the cooling rate thereof so that the beneficial gettering and protective effects are obtained.

The subject matter of the invention is particularly pointed out and distinctly claimed in the concluding portion of the specification. For a complete understanding of the invention together with further objects and advantages thereof, reference should be made to the following description taken in conjunction with the accompanying drawings in which:

Figure 1:
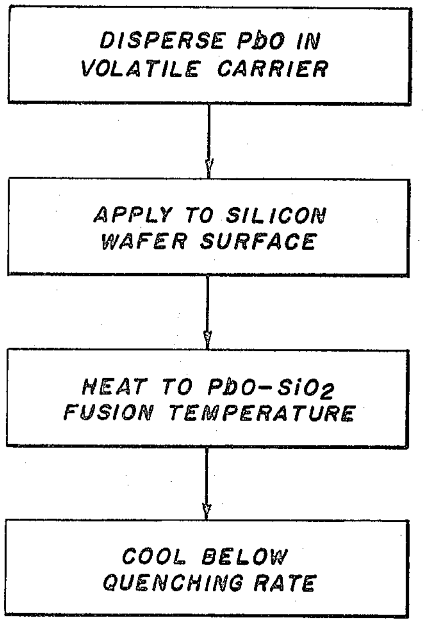
FIG. 1 is a schematic flow diagram of the process of this invention.

Reference should be made to the flow diagram illustrated in FIG. 1 for an outline of the process steps now to be described. First, a slurry of an oxide of lead and a liquid vehicle or carrier is prepared. PbO will be used in this description, but it should be understood that this invention also contemplates the use of red lead, $Pb_3O_4$, which decomposes to form lead oxide at contemplated heating temperatures. An organic vehicle, preferably one of the organic liquids consisting of carbon, hydrogen, and oxygen, such as alcohols, glycols, aldehydes, ketones, ethers, esters, etc. Since these are free of any atoms that could contaminate the wafer, is employed; however, a wide choice of vehicles may be used for what is desired is that the vehicle provide an even suspension of the lead oxygen, such as alcohols, glycols, aldehydes, ketones, oxide and have a high volativity so as to produce quick evaporation when subsequently applied to silicon wafer surface. The proportion of lead oxide suspended in the carrier is not critical and may be varied widely without adverse effect.

The second step in my process is to apply the slurry to a silicon wafer. Application can be by any well known method such as painting or spraying the slurry onto the wafer or dipping the wafer into the slurry. An advantage in painting is that the slurry can be applied to a selected area of the silicon wafer surface without masking. Also, the amount of lead applied can be roughly controlled merely by visually observing the color of the wafer. For example, a wafer painted with lead oxide appears yellow with the intensity of the color increasing as the surface thickness increases.

Before applying the slurry to the wafer, the wafer may be cleaned. For example, a mixture formed of equal parts by weight of formic acid and hydrogen peroxide may be applied and the wafer rinsed in a solution of deionized water. Other known cleaning techniques may be employed; however, cleaning beyond the levels conventionally observed in silicon wafer processing is not essential to the practice of my process.

After application of the slurry, the organic vehicle is volatilized. Volatilization may be achieved by evaporation the carrier at room temperature or by heating of the wafer where it is desired to increase the volatilization rate. A uniformly distributed coating of lead oxide particles remains on the surface of the silicon wafer.

To convert the lead oxide on the wafer surface to a lead silicate glass capable of gettering impurities and shielding the junction the wafer is heated above the fusion temperature of silicon dioxide and lead oxide. When a silicon wafer is exposed to the atmosphere at ambient temperatures, a thin layer of silicon dioxide forms on the surface having a thickness in the order of a few angstroms. Accordingly, when the lead oxide is deposited on the wafer surface, a small amount of silicon dioxide may already be present, but the lead oxide will be present in a greatly predominant amount. By heating the wafer above the minimum eutectic of silicon dioxide and lead oxide, which is 710° C., fusion of the silicon dioxide and lead oxide to form a thin lead silicate glass surface deposit can be initiated. To assure maximum fusion of the silicon dioxide and lead oxide it is preferred to heat the wafer to a temperature of at least 760° C., which is the equilibrium temperature above which mixtures of silicon dioxide and lead oxide are fusible in proportions ranging from about 70% to 95% by weight lead oxide.

The above temperatures assume heating in an oxygen containing atmosphere. If the wafer is heated after lead oxide coating in an oxygen-free atmosphere, such as argon, for example, silicone dioxide initially present on the surface of the wafer will allow fusion to be initiated at 710° C., but it may be necessary to heat the wafer to higher temperatures, up to 880° C., in order to obtain the maximum possible fusion. However, in such instance the proportion of silicon dioxide will be small and only a very thin deposit of lead silicate will be formed, since the unavailability of oxygen will limit glass formation.

In order to utilize the lead oxide efficiently, to obtain thicker glass layers, and to minimize fusion temperatures I prefer to heat the silicon wafer in an oxygen containing atmosphere. By utilizing an oxygen containing atmosphere any deficiency of silicon dioxide inhibiting formation of a glass silicate layer is remedied by the reaction of oxygen with silicon to form additional silicon dioxide. At the same time no risk is encountered of having excess silicon dioxide present which would raise the fusion temperature—i.e., less than 70% by weight lead oxide—since at the outset of heating the proportion of lead oxide to silicon dioxide greatly exceeds this amount and formation of the lead silicate glass limits the reaction of silicon at the wafer surface with the ambient oxygen. Accordingly the formation of lead silicate glass in an oxygen atmosphere during heating may be effectively controlled merely by limiting the quantity of lead oxide initially present and by heating above the minimum fusion temperature of silicon dioxide and lead oxide. For this reason also heating after fusion to form lead silicate glass can be conducted without further affecting wafer passivation. While a wide variety of oxygen containing atmospheres may be employed during heating, such as oxygen, air, and oxygen inert gas mixtures, the atmosphere is maintained substantially free of lead oxide vapor, since this is recognized to have a deleterious effect on silicon wafers.

After glass formation on the silicon wafer surface it is cooled to room temperature. Experimentally it has been found that the rate of cooling of the glass must be controlled to produce the beneficial gettering effects. In the process of diffusing impurities into a silicon wafer for the purpose of producing a P-N junction therein, it is well known in the art that, although the diffusion may be carried out under the purest and cleanest conditions possible, any cleaning of the wafer by a chemical etchant leaves, on the surface of the wafer, a great number of impurities. These are primarily metals, such as iron, nickel, or copper, and in the art they are known as fast diffusers. Upon a subsequent heating of the silicon wafer, such as in the process of this invention, these impurities diffuse rather rapidly into the silicon wafer; in particular, the impurities tend to precipitate out on dislocations on the silicon wafer surface. By their presence on the surface, these impurities provide an effective short across any P-N junction within the wafer. Such a result is known as poisoning the junction and manifests itself in a degraded electrical characteristic of the junction, especially in the reverse-biased region. Reference should be made to the curves of FIG. 2. Curve 10 shows the reverse characteristic of a silicon rectifier before heating, curve 11 shows the same characteristic after heating when impurities are present on the rectifier surface. It can be clearly ascertained that curve 10 is preferable, due to its essentially right angle characteristic, whereas the slope of curve 11 makes such a rectifier less useful as a blocking or voltage determining means in the reverse biased condition.

To prevent a degraded characteristic upon heating, it has been found that the fast diffusers prefer a glass to a silicon wafer surface, probably being more soluble therein. Therefore, the glass coated wafer must be cooled at a controlled rate to allow the impurities to travel to the glass from the silicon. Experimentally, it has been determined that quite satisfactory results can be obtained if the silicon wafer is cooled to room temperature from the glass fusion temperature in a time period of no less than about one minute. A more abrupt cooling or quenching of the wafer will not produce a gettering effect, for the fast diffusers do not have time to travel to the glass layer. Reference should be made to the examples following this specification for a quantative description thereof. In addition to gettering or attracting impurities from the silicon wafer, the lead silicate glass also preferentially receives impurities from the atmosphere that would otherwise contaminate the heated wafer. This insures that a "clean" silicon structure is maintained during the process. After cooling the glass layer shields or passivates the junction of the silicon wafer, thereby protecting it from contamination and improving blocking voltages of the wafer.

Figure 3:
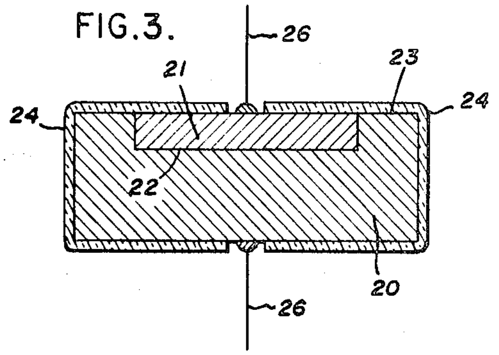

A silicon wafer treated with the process of this invention is schematically shown in FIG. 3. The wafer comprises a region of N-type conductivity 20 and a planar-diffused region of P-type conductivity 21 therein. Established by these regions is a P-N junction 22 which extends to the surface 23 of the silicon wafer. A lead-silicate glass 24 is shown on the exterior surfaces of the silicon wafer. In practice, a lead-silicate glass is required only on surface 23 adjacent the junction, although it preferably covers all otherwise exposed surfaces of the silicon wafer. The leads 26 are attached to the P and N-type conductivity regions of the silicon wafer over which glass is not deposited.

The following examples are illustrative of the process of this invention. In Examples I and II, a glass of varying quality was obtained but no gettering was observed. In Examples III and IV, a glass of good quality was obtained; moreover, gettering occurred.

EXAMPLE I

A silicon wafer having a P-N junction therein was cleaned by boiling in a solution of formic acid and hydrogen peroxide. Simultaneously, a slurry of PbO and ethylene glycol monomethyl ether was prepared. The slurry was then swabbed onto the surface of the silicon wafer and allowed to dry, resulting in a yellow film.

A furnace was preheated to 838° C. and oxygen allowed to flow therethrough during the entirety of the process. The wafer and holder were inserted into the furnace and allowed to remain for three minutes. Thereafter, the wafer was cooled to room temperature in less than 30 seconds.

Upon examination, the wafer showed a fused glass thereon which was generally clear, having few visible defects. A test conducted before the process showed the wafer to have a sharp, well-defined reverse characteristic such as curve 10 of FIG. 2. After the process, tests showed the wafer to have a degraded reverse characteristic, such as curve 11 of FIG. 2, indicating that gettering had not taken place.

This experiment was repeated at 812° C. with identical results.

EXAMPLE II

The experimental conditions in Example I were again present, except that the furnace was maintained at 688° C. The glass proved, upon microscopic examination, not to be fused and had a frosty appearance. The same results were obtained when the experiment was repeated at 704° C. No gettering was observed, as evidenced by lowered voltage blocking characteristics.

EXAMPLE III

The same experimental conditions in Example I were present, excepting that the furnace was maintained at 754° C.

Figure 2:
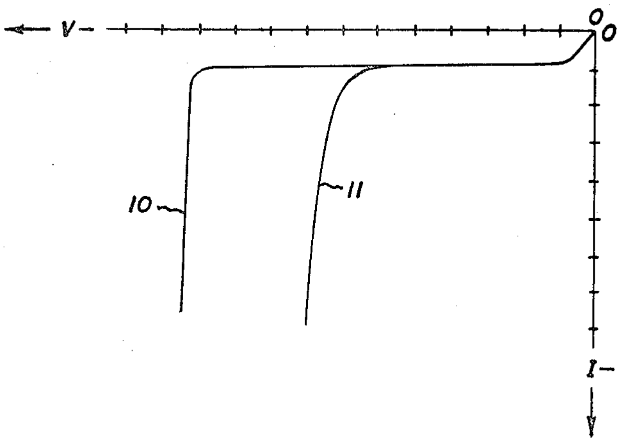
FIG. 2 is a graph of the reverse or third quadrant voltage and current characteristics of a silicon rectifier before and after heating; and, FIG. 3 depicts a cross-section of a silicon wafer having thereon the lead silicate glass of this invention.

Cooling was carried out for a longer period, over 1 minute in duration, and gettering was observed, resulting in a reverse characteristic such as curve 10 of FIG. 2, no degradation of voltage blocking characteristics occurring after heating. Heating at 730° C. also indicated no difficulty in obtaining sufficient glass formation.

EXAMPLE IV

The same experimental conditions in Example I were present except that the furnace was maintained at 772° C. Glass fusion time was 45 seconds, and the glass was cooled over a period of 1 minute.

The glass thus formed had a perfectly clear appearance; must important, gettering was observed, resulting in a reverse characteristic like curve 10 of FIG. 2, no voltage blocking degradation after heating being observed.

Based on the foregoing examples and other successful wafer fabrications, I observed my process to possess several distinct advantages over the conventional processes of forming lead glasses. By applying the lead oxide in a liquid carrier I was able to apply the glass where I chose rather than having the glass cover all exterior surfaces as occurs with conventional lead vapor processes. Further, I avoided the deleterious effects on silicon wafer electrical performance characteristic of lead vapor glass forming processes. Additionally, I noted that the thickness of glass formed according to my process was controllable by regulating the amount of lead oxide initially applied and did not depend on the duration of heating, as is typical of lead vapor processes. Further, I avoided the potentially hazardous step of handling lead in the vapor phase.

What I claim and desire to secure by Letters Patent of the United States is:

1. A method for providing a passivating and gettering silicate glass on only selected areas of the surface of a silicon wafer, including applying to only selected areas of the surface of the wafer, in an atmosphere substantially free of vapor phase lead, a slurry comprising an oxide of lead and a volatilizable vehicle;

allowing the vehicle to volatilize;

heating the silicon wafer in an oxygen-containing atmosphere substantially free of vapor phase lead to a temperature above the eutectic of the oxide of lead and silicon dioxide to fuse a lead silicate glass on the silicon wafer surface confined to the selected areas; and promoting gettering of fast-diffusing metal impurities from the silicon by the lead silicate glass by cooling the silicon wafer at a controlled retarded rate such that the time required for its temperature to fall to room temperature is greater than one minute.

2. A method according to claim 1 wherein the oxide of lead employed is PbO.

3. A method according to claim 1 wherein the silicon wafer is heated to a fusion temperature above 710° C.

4. A method according to claim 1 wherein the silicon wafer is heated to a fusion temperature above 760° C.

5. A method according to claim 1 wherein the volatilizable vehicle employed is an organic liquid consisting of carbon, hydrogen, and oxygen.

6. A method according to claim 1 wherein the volatilizable vehicle employed is a glycol.

7. The product of the process of claim 1.

References Cited

UNITED STATES PATENTS

| | | | |
|---|---|---|---|
| 3,410,736 | 11/1968 | Tokuyama et al. | 117—201 X |
| 3,447,958 | 6/1969 | Okutsu et al. | 117—201 |
| 3,506,502 | 4/1970 | Nakamura | 117—201 X |

WILLIAM L. JARVIS, Primary Examiner

U.S. Cl. X.R.

117—118